(12) United States Patent
Ilic et al.

(10) Patent No.: US 6,943,317 B1
(45) Date of Patent: Sep. 13, 2005

(54) APPARATUS AND METHOD FOR FAST ARC EXTINCTION WITH EARLY SHUNTING OF ARC CURRENT IN PLASMA

(75) Inventors: Milan Ilic, Fort Collins, CO (US); Kalyan N. C. Siddabattula, Fort Collins, CO (US); Andrey B. Malinin, Fort Collins, CO (US)

(73) Assignee: Advanced Energy Industries, Inc., Fort Collins, CO (US)

( * ) Notice: Subject to any disclaimer, the term of this patent is extended or adjusted under 35 U.S.C. 154(b) by 0 days.

(21) Appl. No.: 10/884,119

(22) Filed: Jul. 2, 2004

(51) Int. Cl.[7] ............................................. B23K 9/00
(52) U.S. Cl. ............................ 219/121.57; 219/121.59
(58) Field of Search ..................... 219/121.11, 121.36, 219/121.47, 121.54, 121.57, 121.59, 121.43; 361/58; 315/111.21; 204/192.12, 192.14, 204/298.08; 156/345.44

(56) References Cited

U.S. PATENT DOCUMENTS

| | | | | |
|---|---|---|---|---|
| 5,192,894 A | * | 3/1993 | Teschner ............... | 315/111.21 |
| 5,241,152 A | * | 8/1993 | Anderson et al. ...... | 219/121.57 |
| 5,286,360 A | * | 2/1994 | Szczyrbowski et al. ............ | 204/298.08 |
| 5,303,139 A | * | 4/1994 | Mark ........................ | 363/63 |
| 5,535,906 A | | 7/1996 | Drummond | |
| 5,645,698 A | | 7/1997 | Okano | |
| 5,718,813 A | * | 2/1998 | Drummond et al. ... | 204/192.12 |
| 5,917,286 A | * | 6/1999 | Scholl et al. ............ | 315/111.21 |
| 5,990,668 A | * | 11/1999 | Coleman ................... | 323/271 |
| 6,222,321 B1 | * | 4/2001 | Scholl et al. ............ | 315/111.21 |
| 6,524,455 B1 | | 2/2003 | Sellers | |
| 6,552,296 B2 | * | 4/2003 | Smith et al. ............ | 219/121.43 |
| 6,621,674 B1 | * | 9/2003 | Zahringer et al. ............ | 361/58 |

FOREIGN PATENT DOCUMENTS

JP                61030655 A       2/1986

* cited by examiner

*Primary Examiner*—Tu Hoang
(74) *Attorney, Agent, or Firm*—Benjamin Hudson, Jr.; John D. Pirnot

(57) ABSTRACT

There is provided by this invention a novel apparatus and method of operating a dc plasma process that diverts the power supply current from the plasma at the initiation of an arc, thereby inhibiting energy from flowing from the power supply to the plasma, and then to allow energy to flow again when the power supply re-enables energy flow to the plasma. The diverting means is connected to the output of the power supply to divert current away from the plasma at the initiation of an arc wherein the diverting means is actuated when the arc is detected on the output and diverts the current for a first pre-determined time. The diverting means is released at the end of the first pre-determined time before the current reaches zero wherein current is redirected to the plasma and the diverting means is reactivated at the end of a second pre-determined time in the event the arc is not extinguished.

14 Claims, 5 Drawing Sheets

APPARATUS AND METHOD FOR FAST ARC EXTINCTION WITH EARLY SHUNTING OF ARC CURRENT IN PLASMA

BACKGROUND OF THE INVENTION

1. Field of the Invention

This invention relates generally to power supplies that detect and prevent or extinguish arcs in plasma processing applications, and more particularly to dc processes and apparatus and methods to extinguish arcs therein.

2. Brief Description of the Prior Art

A cathodic arc is said to develop in a plasma-based process when a discharge occurs between a point on an insulator where charge has accumulated and a point on the cathode. The impedance of the plasma then collapses and this is often termed a micro arc. In the past, these micro arcs were often ignored as not important. Oftentimes their very existence went undetected, since the power supply did not detect their existence directly. If a micro arc does not extinguish fast enough, there can be a cascading effect where the micro arc develops into what is termed as a hard arc. The plasma is then discharged through this hard arc, creating a very high density of power that can, if not extinguished quickly, be very detrimental to the process and the quality of the film.

Past approaches to arc control in dc plasma processes have focused upon the reduction of energy supplied by a dc power supply into an arc, or they have used high frequency or medium frequency power in conjunction with dc power to minimize or eliminate the onset of arcing. Power supplies that store very little energy, such as those taught in U.S. Pat. No. 5,535,906, deliver very little energy into an arc beyond what is stored in the output cable. Such a power supply extinguishes arcs by turning off after the arc is detected. After the power supply turns off, the energy stored in the cable is dissipated into the arc and losses in the cable and power supply. This type of power supply requires active circuitry to sense the arcs, and to turn the power supply on and off.

Alternatively, passive circuitry can be used to extinguish arcs as they occur without disturbing the power supply's regulation or logic circuits, as is taught in U.S. Pat. No. 5,645,698 and U.S. Pat. No. 6,524,455, for example. The passive elements generally include an inductance and capacitance to provide a resonant circuit that rings the current to zero in the plasma, thus turning off the arc. The inductance may include a discrete inductor, but may also be just the inductance of the output cable that connects the power supply to a plasma chamber. Typical times of this ring out range from a few microseconds to tens of microseconds. Passive ring out circuits produce large overshoots in the output current, and depending on the values of the resonant components, this may result in large amounts of energy being dumped into the process. U.S. Pat. No. 6,524,455 and JP 61030655A teach resonant ring out circuits that can extinguish arcs in a few microseconds.

In many power supplies, the output filter inductance stores much more energy than the cable inductance, so if the power supply is simply turned off after an arc is sensed, a large amount of energy may be delivered to the arc even when the energy stored in the output capacitance is relatively low. One approach to reduce the amount of the stored inductive energy that is delivered to the load uses a switch in series with the output of the power supply that is opened so as to prevent the current from reaching the plasma. Because this method involves interruption of inductor current, large voltage spikes can be developed across the switch, and this requires having an effective means of dissipating the inductive energy to protect the switch.

It is generally accepted in the industry that the best approach to extinguish arcs is to reduce the current through them to zero, or some predetermined low threshold value. FIG. 1 illustrates the typical arc ring out process. The easiest way to ring out the arc is to create a resonant circuit, not shown, between the capacitor $C_{out}$ on the output of the power supply which also typically serves as the filter capacitor for the dc power supply and an inductance $L_{arcout}$ that may include a discrete inductor inserted in series with the output of the power supply, but may also be just the inductance of the output cable of the power supply. In typical ring out circuits, the arc is extinguished by driving the current to zero.

As shown in FIG. 1, the time between $t_1$ to $t_2$ is the initiation of the arc. The ring out occurs between times $t_2$ and $t_3$. The current reaches zero at time $t_3$, and the arc is extinguished. At $t_4$, the plasma recovers naturally. $I_{peak}$ is the peak value of the current produced by the ring out. The voltage waveforms plotted in FIGS. 1 and 3 are the voltage at the chamber, referenced to the negative input terminal of the chamber. The current waveforms illustrate the current flowing into the positive input terminal of the chamber.

The approximate values of $I_{peak}$, and the time interval ting as defined in FIG. 1, can be calculated by the following equations:

$$t_{ring} = \pi \cdot \sqrt{L_{arcout} \cdot C_{out}}$$
$$I_{peak} = V_{dc} / Z_{arcout}$$
$$\text{where } Z_{arcout} = \sqrt{L_{arcout} / C_{out}}.$$

The passive ring out approach has at least the following disadvantages:

1) In order to ensure that the current consistently reaches zero, the peak current has to be at least twice the dc value of the current. This means that the current peaks can be very high.

2) In order to ensure that the current rings to zero, the value of $Z_{arcout}$ must be low enough to accommodate the maximum output current at the minimum output voltage. This causes the ring out currents to be considerably greater than is necessary when operating at output voltages that are higher than the minimum output voltage.

3) The power supply output voltage reverses polarity as the output current is driven toward zero. Having too large of a reverse voltage can be detrimental if a reverse current flows after the arc, so extra circuitry to prevent reverse currents may sometimes be required, as is taught in U.S. Pat. No. 6,645,698 and U.S. Pat. No. 6,524,455.

It would be desirable if there were provided a power supply for dc plasma processes that prevented micro arcs from developing into hard arcs and allowed a fast ring out of arcs. It would also be desirable if power supplies provided an ultra-low energy discharge into arcs, and which also operated sufficiently fast to prevent the plasma from being extinguished in sensitive applications such as self-ionized plasmas. It is an object of this invention to provide a power supply and method for a dc based plasma process that diverts current from the plasma at the initiation of an arc.

SUMMARY OF THE INVENTION

There is provided by this invention a power supply for dc based plasma processes that reduces the effects of arcing in the process by minimizing the current delivered to the arc, and by utilizing a shunt switch to divert current away from the plasma early in the arc initiation process, thus substantially decreasing the probability that a micro arc will develop into a hard arc. After a predetermined short time interval following the actuation of the shunt switch, the power supply turns off the shunt switch and checks to see if the output voltage rises. If the output voltage does rise, the shunt switch remains off, and normal operation resumes. If the output voltage remains low, the shunt switch is turned on again to allow further time for the arc to become extinguished.

DESCRIPTION OF THE PREFERRED EMBODIMENT

Figure 1:
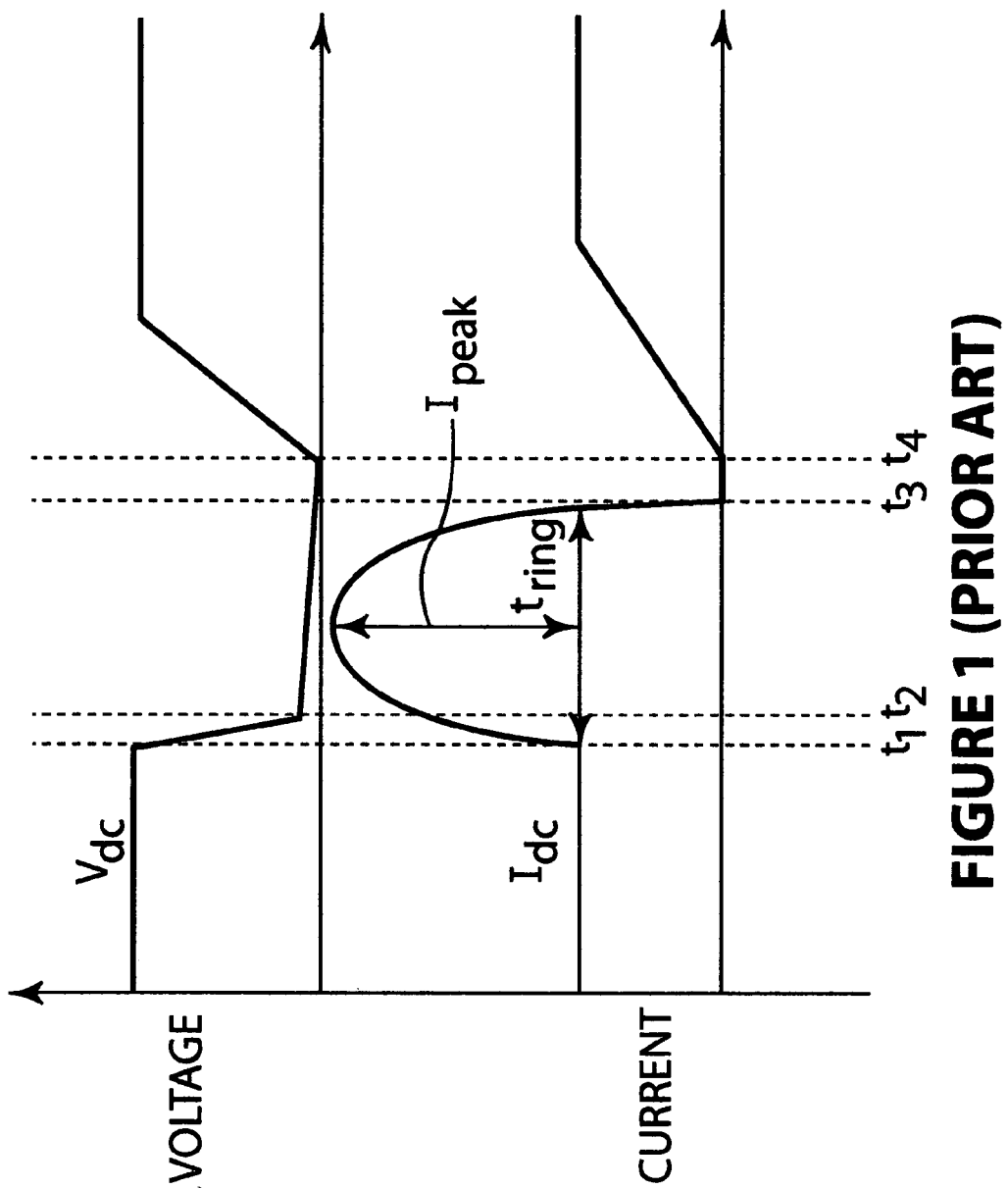
FIG. 1 illustrates the prior art voltage and current waveforms for resonant circuits utilized in power supplies to ring out an arc.
Figure 2:
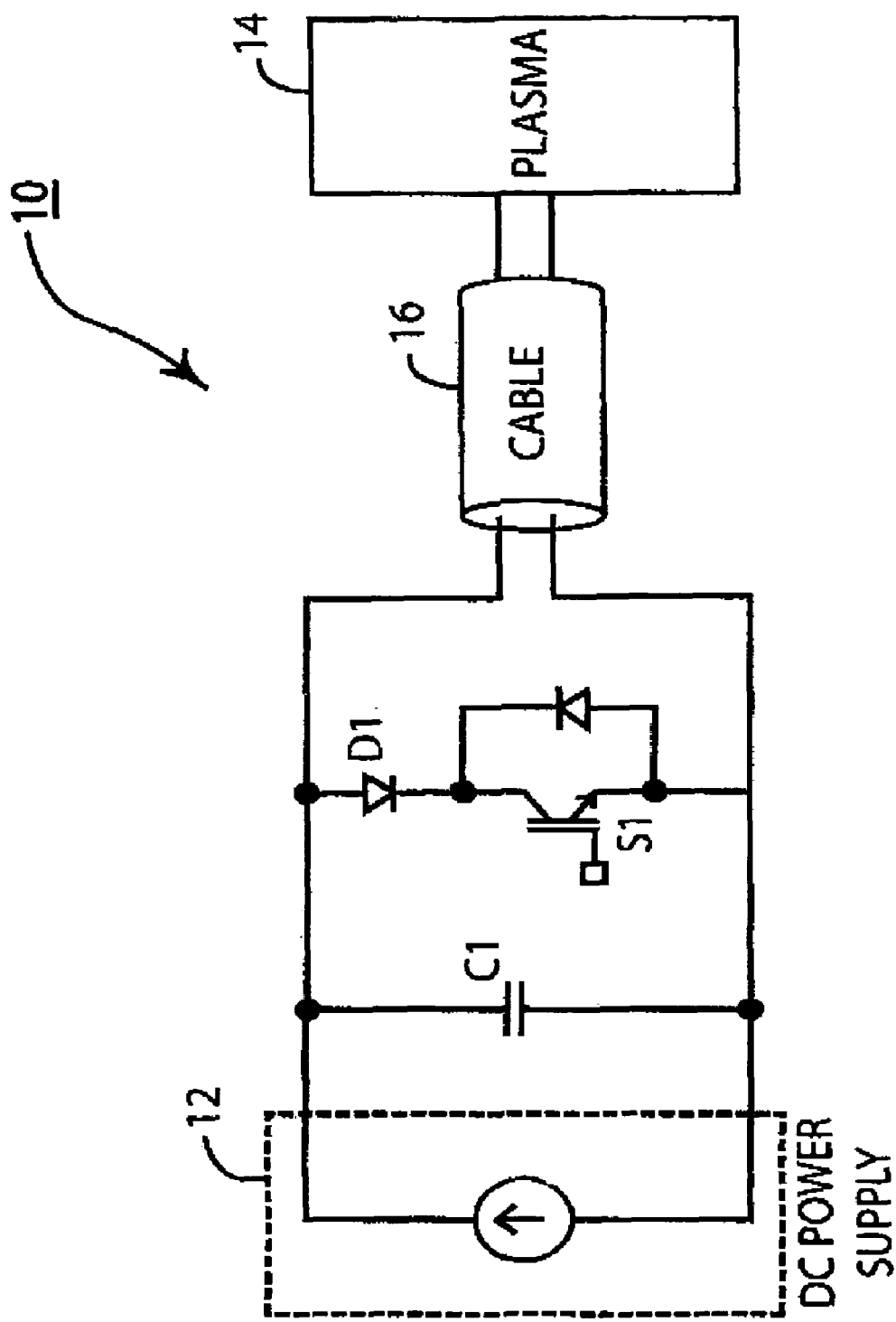
FIG. 2 illustrates dc plasma processing apparatus incorporating the principles of this invention.

Referring to FIG. 2 there is shown a dc plasma processing apparatus 10 that incorporates the principles of this invention. A dc power supply 12 supplies power to plasma 14 via a cable 16. The plasma 14 is ignited between electrodes (not shown), and is contained in a chamber (not shown) for processing a work piece on a substrate also not shown but well known to those skilled in the art. Connected in parallel with the output capacitor C1 is a shunt switch $S_1$. The shunt switch may be an insulated-gate bipolar transistor (IGBT), field effect transistor (FET), or other suitable semiconductor switch.

The dc power supply should be designed to be a compliant current source on the time scale of the arc so that its output current will not rise very much when the output voltage is decreased when arcs occur. The typical way do achieve high compliance in the dc power supply is to have either a sufficiently large inductance in series with the output, or have a fast current programmed current controller.

The output capacitor C1 is designed to store the minimum possible energy while still providing adequate filtering. If the filter capacitance is sufficiently small, it is usually possible to limit the rise in the output current of the plasma processing apparatus when micro arcs occur to a value that is low enough to prevent micro arcs from developing into hard arcs.

Figure 3:
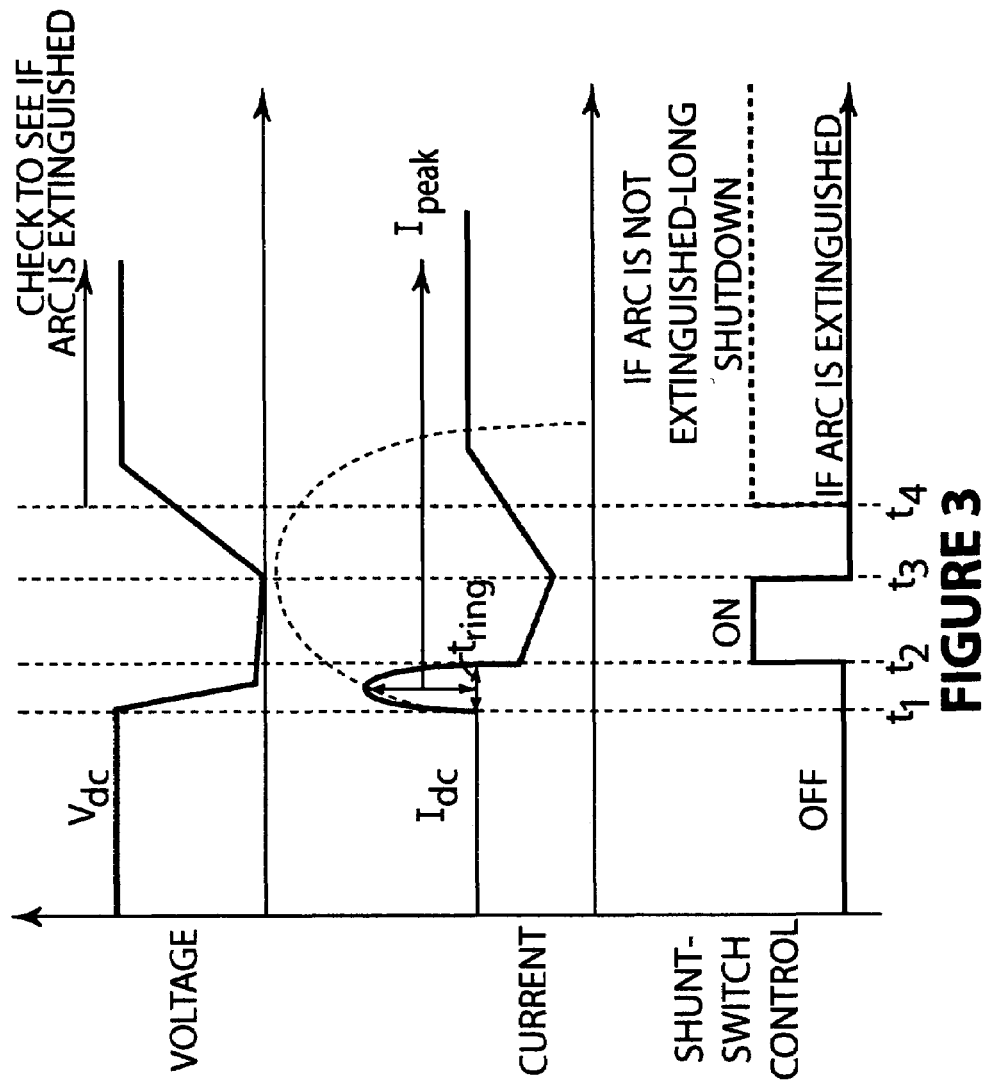
FIG. 3 illustrates the voltage and current waveforms for the dc plasma processing apparatus shown in FIG. 2 with the prior art current waveform of FIG. 1 superimposed.

FIG. 3 illustrates the operating characteristics of the control scheme for the dc plasma processes shown in FIG. 2. At time $t_1$ the arc is initiated in the plasma. There is a natural ring out provided by the output capacitance C1 and the inductance of the cable 16 $L_{cable}$.

$$t_{ring} = \pi \cdot \sqrt{L_{cable} \cdot C1}$$
$$I_{peak} = V_{dc} / Z_{arcout}$$
Where $Z_{arcout} = \sqrt{L_{cable} / C1}$ A diode D1 is inserted in series with the shunt switch $S_1$ to allow the voltage across C1 to reverse as it resonates with the inductance of the output cable. D1 is forward biased when the shunt switch is diverting current.

The voltage drop and current rise at the output of the power supply are delayed by the interaction of cable inductance with C1. This delays the time at which arcs can be detected.

The shunt switch $S_1$ is controlled by a control circuit (not shown) that functions to turn the switch on or off in the following manner. Shunt switch $S_1$ is turned ON after the arc is detected by the power supply 12. The switch is optimally turned on shortly after C1 has been discharged to prevent the switch from having to absorb the energy stored in the capacitor. With the circuit of FIG. 2, the shunt switch shouldn't turn on until C1 is discharged, but that doesn't occur until about the time of the peak of the current ring up.

The shunt switch has no effect during the time interval in which the output voltage is reversed. The dc power supply continues to deliver current to the output cable during this interval. Following the ring out of the voltage across C1, the current from the power supply is diverted away from the cable and the plasma because the switch is ON. This allows the energy in the cable to decay. The slope of the current decay depends on the inductance of the cable and the voltage across the arc. The current decay is seen between the times $t_2$ and $t_3$, which can be controlled. The value of C1 is preferably selected to be only as large as is required for filtering the output current of the power supply. Unlike conventional ring out circuits, the output current does not need to ring to zero, so the output current does not need to rise to a minimum of twice the steady-state value. The limited output current of the power supply usually allows micro arcs to be extinguished well before the current through the plasma reaches zero.

At the end of time $t_3$, the shunt switch is turned OFF. This causes the current from the power supply to flow to the plasma again before the current in the cable has decayed to zero. Experiments performed by the inventors have shown that, in most cases, the plasma voltage rises after the shunt switch is turned OFF, if the on-time of the switch lasts for at least a certain minimum time interval that is typically on the order of 5–10 microseconds, but could be longer (on the order of 20 microseconds) for some plasmas. If the output voltage rises above a predetermined threshold after the switch is turned OFF, the switch remains OFF, and the power supply can continue delivering power. In the case that the voltage does not come up, the shunt switch may be turned ON again.

There are several options for determining for how long the switch should be turned ON when the voltage doesn't rise when the shunt switch is turned OFF at time $t_3$, each of which may be advantageous for a particular plasma type:

1) The switch can be turned ON for a predetermined time interval that is long enough to ensure that the current in the cable decays completely. The time interval may be set to a length that is substantially longer than the current decay time in order to allow cooling of hotspots that may develop during hard arcs.

2) The switch can be turned ON for a predetermined time interval that is not long enough to ensure that the current in the cable decays completely. Following that time interval, the switch will be turned OFF when the output current falls below some pre-determined threshold.

3) The switch can be turned ON for a predetermined time interval that is not long enough to ensure that the current in the cable decays completely. If the arc is extinguished before the plasma current goes to zero, the voltage across the plasma will rise due to the energy stored in the cable inductance. This will cause the output current to decay rapidly. The power supply output voltage will not rise because of C1, but the end of the arc can be sensed by detecting a rapid drop in the plasma current. In this implementation, the switch will be turned OFF when the power supply senses a rapid decay in the plasma current.

4) The switch can be turned on for a predetermined time interval that is not long enough to ensure that the current in the cable decays completely. If the arc is extinguished before the output current goes to zero, the voltage across the plasma will rise due to the energy stored in the cable inductance. This will cause the output current to decay rapidly. If there is an inductance in series with the output terminals of the power supply, the power supply output voltage will rise when the arc turns off due to the change in the current flowing through this inductance, even though the voltage across C1 does not rise. In this implementation, the switch will be turned OFF when the power supply senses a rise in the output voltage, or a rise in the voltage across the inductance. This series inductance can be realized with one or more discrete inductors, or with the differential-mode inductance of an EMI filter such as the one shown in FIG. 5 that is connected between C1 and the output terminals.

Figure 4:
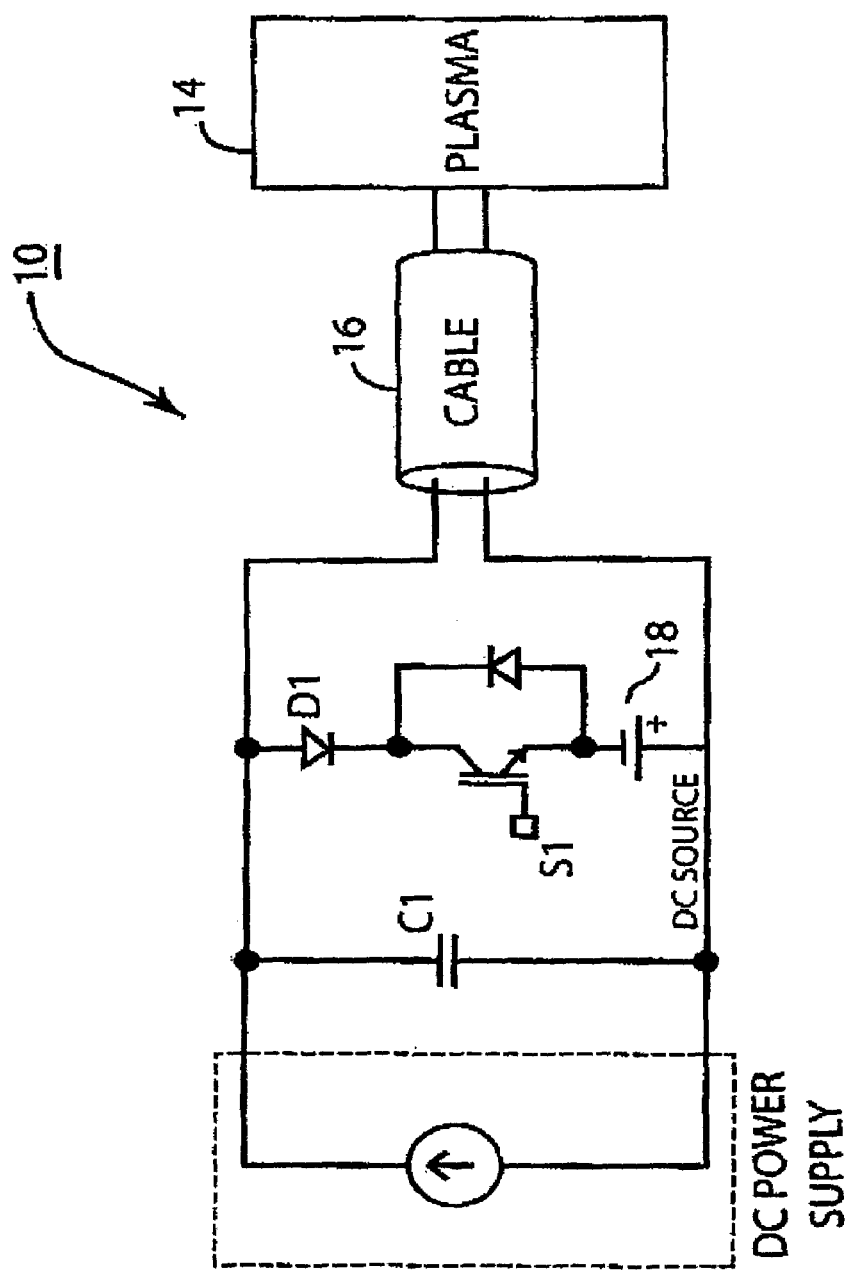
FIG. 4 illustrates another embodiment of dc plasma processing apparatus incorporating the principles of this invention.

The methods for sensing when an arc has become extinguished that are described in options 3 and 4 could be utilized to determine when to re-enable any dc plasma power supply in which the output power is inhibited following the occurrence of an arc condition in the plasma. Referring to FIG. 4 there is shown an alternate embodiment of the dc plasma processing apparatus 10 that incorporates the principles of this invention. In situations where the cable 12 has a high inductance or for processes that require a very quick arc recovery, a dc source 18 is placed in series with the shunt switch. The dc source provides a negative voltage, which increases the slope of the current in the period $t_3$ to $t_2$, and pulls the current lower and faster, thus increasing the probability of extinguishing the arc. The arc handling circuits of this invention are capable of extinguishing arcs in most cases without the plasma current going to zero. Because C1 resonates with the inductance of the output cable, however, there will be some operating conditions, particularly at higher output voltages and also low output currents, in which the plasma current will naturally ring to zero, independent of the operation of the shunt switch.

Figure 5:
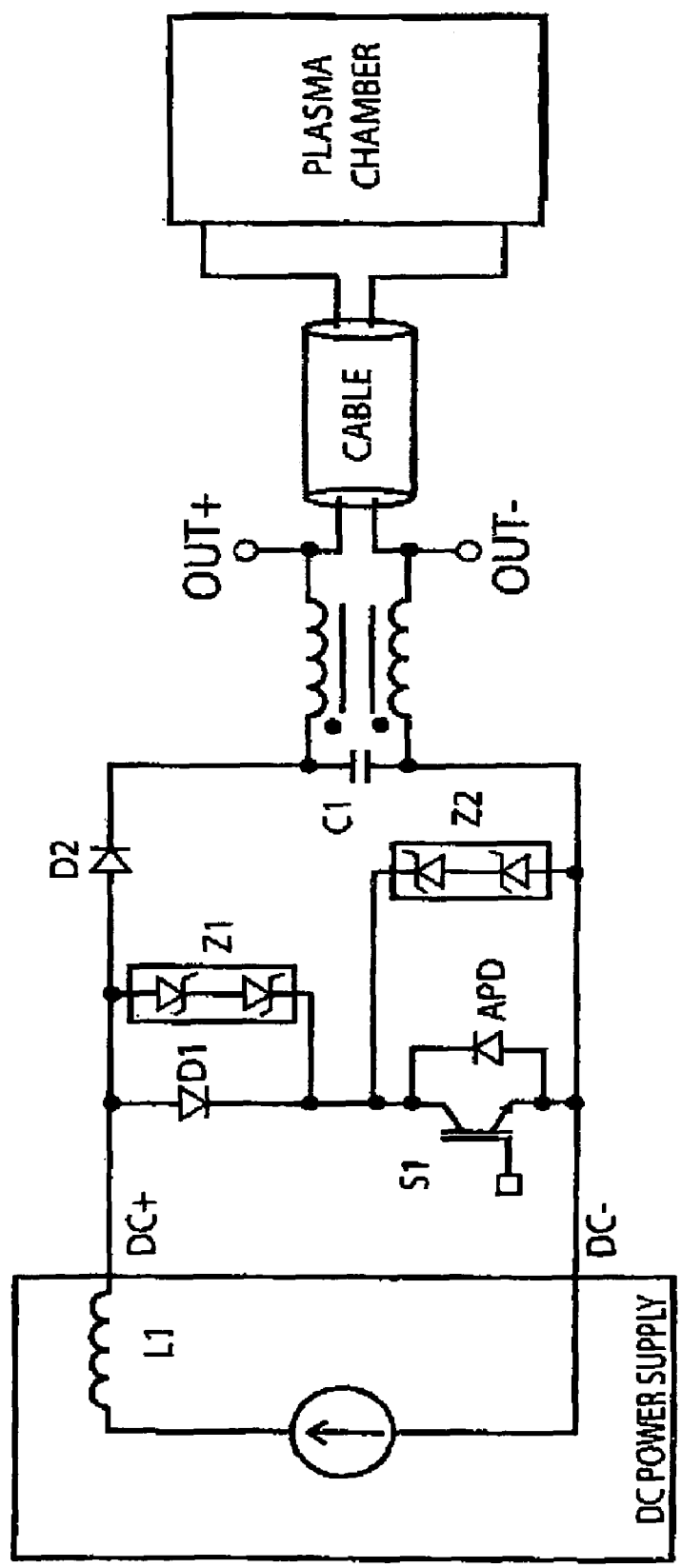
FIG. 5 illustrates a more detailed dc plasma processing apparatus incorporating the principles of this invention.

The circuit in FIG. 5, however, has a blocking diode D2 inserted between the shunt switch and C1, and this allows the shunt switch to be turned on at any time without having to worry about dumping the energy of C1 into the switch. Clamping diode assemblies Z1 and Z2 protect S1 and D1 from transient overvoltages. L1 represents the filter inductance in the dc power supply 12 which may consist of one or more inductors. In addition to providing filtering, it allows the power supply to act as a current source on the time scale of the arcs even if the impedance of the power supply ahead of the filter is relatively low. The shunt switch prevents the energy stored in L1 from being dumped into the arc. While the shunt switch is on, the current flowing in L1 can circulate through it back through the power supply in a manner that dissipates relatively little energy. The energy remaining in the inductor is available to be released into the plasma when the shunt switch is turned off. If the energy delivered by C1 to the arc is sufficiently low so that a hard arc is not formed, then the shunt switch may be turned OFF after only a few microseconds, well before the current in the output cable and the plasma decays to zero. The energy released from L1, helps the plasma process quickly return to steady-state operation.

If the arc condition in the plasma persists after power flow from the power supply is reinstated following the short interruption interval, then the shunt switch is turned ON again, to allow more time for the arc to become extinguished. When the shunt switch is eventually turned OFF, any remaining energy stored in L1 helps the plasma process return to steady-state operation more rapidly than if the inductor current had to build up from zero.

The invention as described herein teaches diverting the current from the plasma by placing a shunt switch at the output of the power supply in parallel with the output capacitor. However, it should be understood that an object of this invention is to divert the power supply current from the plasma at the initiation of an arc, thereby inhibiting energy from flowing from the power supply to the plasma, and then to allow energy to flow again when the power supply re-enables energy flow to the plasma. This can be accomplished in other ways well known to those skilled in the art. For example, other embodiments of the invention can be realized by placing the shunt switch in parallel with a power supply inductor, or in parallel with a separate winding on a power supply inductor. Still other embodiments of the invention may be realized by using other methods for diverting and re-enabling energy flow from the power supply into the plasma in accordance with the timing and control strategies described herein.

Although there is illustrated and described specific structure and details of operation, it is clearly understood that the same were merely for purposes of illustration and that changes and modifications may be readily made therein by those skilled in the art without departing from the spirit and the scope of this invention.

We claim:

1. Apparatus for a dc plasma process, comprising:
   a) a chamber for plasma processing;
   b) a power supply having an output capacitor for supplying voltage to the chamber to ignite a plasma and deliver power;
   c) a shunt switch disposed between the power supply and the chamber to divert current away from the plasma at an initiation of an arc; and
   d) a blocking diode connected to an output terminal of the shunt switch to isolate the output capacitor from the shunt switch.

2. Apparatus for a dc plasma process as recited in claim 1 wherein the actuation of the shunt switch occurs after the arc is detected, and diverts the current for a first predetermined time interval.

3. Apparatus for a dc plasma process as recited in claim 2 wherein the shunt switch is released at the end of the first predetermined time interval before current in the plasma reaches zero, wherein current is redirected from the power supply to the plasma.

4. Apparatus for a dc plasma process as recited in claim 3 wherein the shunt switch is reactivated at the end of a second predetermined time interval in the event the arc is not extinguished.

5. Apparatus for a dc plasma process, comprising:
   a) a chamber for plasma processing;
   b) a power supply for supplying voltage to the chamber to ignite plasma and deliver power;
   c) a shunt switch in parallel with an output capacitor of the power supply to divert current away from the plasma at an initiation of an arc; and
   d) a dc source in series with the shunt switch wherein the dc source provides a voltage that aids in extinguishing the arc.

6. Apparatus for a dc plasma process as recited in claim 5 wherein a diode is connected in series with the shunt switch such that the diode is forward biased when the shunt switch is diverting current.

7. Apparatus for a dc plasma process as recited in claim 6 wherein actuation of the shunt switch occurs after the arc is detected, and diverts the current for a first predetermined time.

8. Apparatus for a dc plasma process as recited in claim 7 wherein the shunt switch is released at the end of the predetermined time interval before current in the plasma reaches zero, wherein current is redirected from the power supply to the plasma.

9. Apparatus for a dc plasma process as recited in claim 8 wherein the shunt switch is reactivated at the end of a second predetermined time in the event the arc is not extinguished.

10. A method of operating a dc plasma process comprising:
    a) delivering voltage, current and power from a set of at least two output terminals of a power supply to a plasma chamber to ignite and sustain a plasma, the power supply having stored energy;
    b) sensing an arc condition in the plasma;
    c) inhibiting the flow of power from the power supply to the plasma for a predetermined interruption time interval following the sensing of an arc condition;
    d) reinstating the flow of power from the power supply to the plasma after the predetermined interruption time interval such that said stored energy is released to into the plasma; and
    re-inhibiting the flow of power from the power supply to the plasma if an arc condition is sensed following said reinstatement of power from the power supply.

11. A method of operating a dc plasma process as described in claim 10 wherein said interruption time interval is less than 20 microseconds in duration.

12. A method of operating a dc plasma process as described in claim 11 wherein the step of sensing an arc condition consists of comparing a plasma voltage with a predetermined threshold value.

13. A method of operating a dc plasma process as described in claim 10 further comprising the steps of:
    sensing a sudden drop of plasma current, and
    reinstating the flow of power from an inhibited power supply.

14. A method of operating a dc plasma process as described in claim 10 further comprising the steps of:
    sensing a sudden rise in the voltage between said set of at least two output terminals, and
    reinstating the flow of power from an inhibited power supply.

* * * * *